(12) United States Patent
Lee et al.

(10) Patent No.: US 12,349,572 B2
(45) Date of Patent: Jul. 1, 2025

(54) DISPLAY DEVICE AND METHOD OF MANUFACTURING THE SAME

(71) Applicant: Samsung Display Co., Ltd., Yongin-si (KR)

(72) Inventors: Dongmin Lee, Yongin-si (KR); Taewook Kang, Yongin-si (KR); Hyunah Sung, Yongin-si (KR); Dokeun Song, Yongin-si (KR); Hyuneok Shin, Yongin-si (KR); Yunjong Yeo, Yongin-si (KR); Daewon Choi, Yongin-si (KR); Shinil Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 400 days.

(21) Appl. No.: 17/709,417

(22) Filed: Mar. 31, 2022

(65) Prior Publication Data

US 2023/0047134 A1    Feb. 16, 2023

(30) Foreign Application Priority Data

Aug. 10, 2021    (KR) .................. 10-2021-0105484

(51) Int. Cl.
*H10K 59/131*    (2023.01)
*H10K 71/00*    (2023.01)

(52) U.S. Cl.
CPC ......... *H10K 59/1315* (2023.02); *H10K 71/00* (2023.02)

(58) Field of Classification Search
CPC .................... H10K 59/1315; H10K 71/00
See application file for complete search history.

(56) References Cited

U.S. PATENT DOCUMENTS

| | | |
|---|---|---|
| 11,538,881 B2 * | 12/2022 | Lee ............... H10K 59/123 |
| 2009/0102053 A1 | 4/2009 | Han |
| 2020/0111854 A1 * | 4/2020 | Chung .............. H01L 27/1255 |
| 2020/0235196 A1 | 7/2020 | Lee et al. |

FOREIGN PATENT DOCUMENTS

| | | |
|---|---|---|
| JP | 2012-248781 | 12/2012 |
| KR | 10-2003-0083172 | 10/2003 |
| KR | 10-2020-0089789 | 7/2020 |

* cited by examiner

*Primary Examiner* — Douglas M Menz
(74) *Attorney, Agent, or Firm* — KILE PARK REED & HOUTTEMAN PLLC

(57) ABSTRACT

A display device includes: a first inorganic insulating layer; a wiring disposed on the first inorganic insulating layer; a second inorganic insulating layer covering the wiring; and a display element disposed on the second inorganic insulating layer, wherein the wiring includes a lower layer including at least one of aluminum and an aluminum alloy, an upper layer disposed on the lower layer and including at least one of titanium and titanium oxide, and an intermediate layer disposed between the lower layer and the upper layer and including titanium aluminide.

10 Claims, 14 Drawing Sheets

FIG. 6

| CASE | I | II | III | IV |
|---|---|---|---|---|
| WHETHER OR NOT HEAT TREATMENT IS PERFORMED | X | O | O | O |
| LOWER LAYER | Al | Al | Al | Al |
| UPPER LAYER | Ti | TiN | | Ti |
| IMAGE | | | | |
| THERMAL CORROSION | O | O | O | X |

| THICKNESS OF LOWER LAYER (Å) | 3500 | 3500 | 3500 |
|---|---|---|---|
| THICKNESS OF UPPER LAYER (Å) | 50 | 100 | 200 |
| TEM MAPPING (Al & Ti) |  |  |  |
| TEM IMAGE |  |  |  |

FIG. 9A

| THICKNESS OF LOWER LAYER (Å) | 3500 | 3500 |
|---|---|---|
| THICKNESS OF UPPER LAYER (Å) | 50 | 300 |
| TEM IMAGE | | |
| TEM Mapping (O) | 16.2nm, 11.8nm, 10.2nm, 10.7nm | 33.1nm, 29.1nm, 23.3nm, 21.5nm |

FIG. 9B

| THICKNESS OF LOWER LAYER (Å) | 3000 |
|---|---|
| THICKNESS OF UPPER LAYER (Å) | 300 |
| TEM IMAGE | |
| TEM Mapping (O) | 6.8nm, 8nm, 5.1nm |

DISPLAY DEVICE AND METHOD OF MANUFACTURING THE SAME

CROSS REFERENCE TO RELATED APPLICATION

This application claims priority from and the benefit of Korean Patent Application No. 10-2021-0105484, filed on Aug. 10, 2021, which is hereby incorporated by reference for all purposes as if fully set forth herein.

BACKGROUND

Field

Embodiments of the invention relate generally to a display device and a method of manufacturing the display device and more specifically, to a display device including a wiring having a multi-layer structure and a method of manufacturing the display device.

Discussion of the Background

Display devices visually display data. The display devices have been used as displays of small products such as mobile phones, or used as displays of large products such as televisions.

To display an image to the outside, the display devices include a plurality of sub-pixels that receive electrical signals to emit light, and each of the plurality of sub-pixels include a display element. Recently, as needs for high-resolution image and high-density circuits increase, demands for wirings having low resistance and high reliability for display panel have increased.

The above information disclosed in this Background section is only for understanding of the background of the inventive concepts, and, therefore, it may contain information that does not constitute prior art.

SUMMARY

Display devices including wirings constructed according to the principles of the invention are capable of reducing electrical resistance of the wires and improving reliability by preventing or minimizing thermal corrosion of the wires. For example, the wirings of the display devices include at least one of aluminum (Al) and an aluminum alloy, and thus, the wirings have low resistance and improved reliability by preventing or minimizing thermal corrosion thereof.

Methods of manufacturing the display devices according to the principles of the invention are capable of reducing electrical resistance of wires of the display devices and improving reliability by preventing and minimizing thermal corrosion of the wires thereof.

Additional features of the inventive concepts will be set forth in the description which follows, and in part will be apparent from the description, or may be learned by practice of the inventive concepts.

According to an aspect of the invention, a display device includes a first inorganic insulating layer, a wiring disposed on the first inorganic insulating layer, a second inorganic insulating layer covering the wiring, and a display element disposed on the second inorganic insulating layer, wherein the wiring includes a lower layer including at least one of aluminum and an aluminum alloy, an upper layer disposed on the lower layer, the upper layer including at least one of titanium and titanium oxide, and an intermediate layer disposed between the lower layer and the upper layer, the intermediate layer including titanium aluminide.

A width of the wiring in a horizontal direction may decrease as moving in a vertical direction in which the second inorganic insulating layer is stacked from the first inorganic insulating layer.

The wiring may further include a lower oxide layer disposed on a side surface of the lower layer, an intermediate oxide layer disposed on a side surface of the intermediate layer, and an upper oxide layer disposed on a side surface of the upper layer.

A thickness of the lower oxide layer may be from about 10 nm to about 40 nm.

A thickness of the upper layer may be from about 30 Å to about 400 Å.

The upper layer may include a first upper layer including titanium and a second upper layer disposed on the first upper layer, the second upper layer including titanium oxide.

An angle between an upper surface of the first inorganic insulating layer facing the wiring and a side surface of the wiring may be about 70 degrees or less.

The first inorganic insulating layer may include a first region overlapping the wiring and a second region adjacent to the first region, and an upper surface of the first inorganic insulating layer in the first region and an upper surface of the first inorganic insulating layer in the second region may have a step difference therebetween.

The aluminum alloy may include at least one of nickel, lanthanum, neodymium, and germanium.

The wiring may be heat-treated.

According to another aspect of the invention, a method of manufacturing a display device includes: providing a lower conductive layer disposed on a first inorganic insulating layer and including at least one of aluminum and an aluminum alloy, providing an upper conductive layer disposed on the lower conductive layer and including titanium, dry-etching a portion of the lower conductive layer and a portion of the upper conductive layer to provide a lower layer and an upper layer on the lower layer, and forming an intermediate layer including titanium aluminide between the lower layer and the upper layer by a heat treatment performing on the lower layer and the upper layer.

The dry-etching of the portion of the lower conductive layer and the portion of the upper conductive layer may include forming a photoresist pattern on the upper conductive layer, dry-etching the portion of the lower conductive layer and the portion of the upper conductive layer by using the photoresist pattern as a photomask, and removing the photoresist pattern.

After the portion of the lower conductive layer and the portion of the upper conductive layer are dry-etched, at least one of chlorine and chlorine radicals may remain on a side surface of the lower layer and a side surface of the upper layer.

The removing of the photoresist pattern may include removing at least a portion of the lower layer to form a protruding tip on the upper layer.

The forming of the intermediate layer may include removing the protruding tip.

The forming of the intermediate layer may include forming a lower oxide layer on a side surface of the lower layer and forming an upper oxide layer on a side surface of the upper layer.

A thickness of the lower oxide layer may be from about 10 nm to about 40 nm.

The forming of the intermediate layer may include generating inter-diffusion between the lower layer and the upper layer.

The heat treatment performed on the lower layer and the upper layer may be performed at a temperature of about 350° C. to about 500° C.

The method may further include forming a second inorganic insulating layer covering the lower layer, the intermediate layer, and the upper layer.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIG. 6 is a table showing thermal corrosion of a wiring according to a material of a lower layer, a material of an upper layer, and whether or not heat treatment is performed.

FIG. 9A is a schematic cross-sectional image of a wiring according to an embodiment.

FIG. 9B is a schematic cross-sectional image of a wiring according to a comparative example.

DETAILED DESCRIPTION

Figure 1:
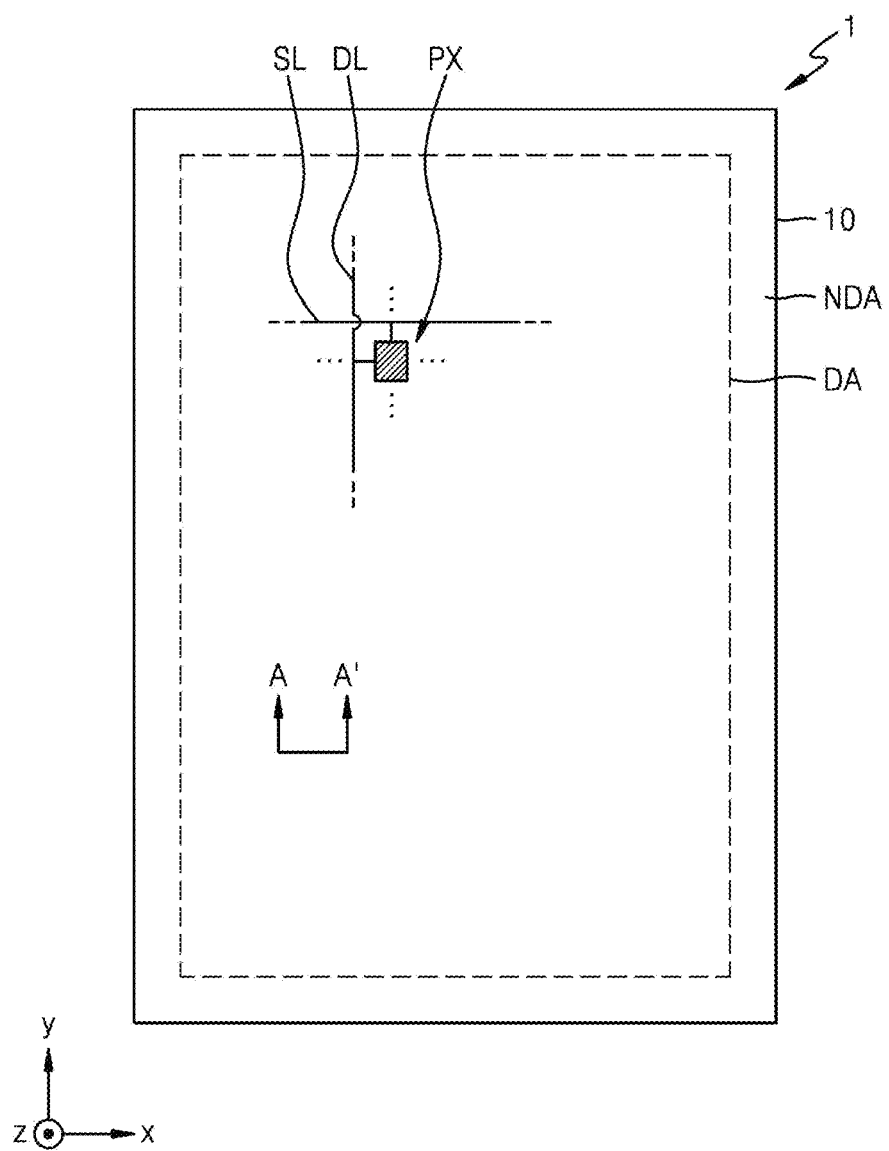
FIG. 1 is a schematic plan view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, such as the x, y, and z-axes, and may be interpreted in a broader sense. For example, they may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic plan view of a display device 1 according to an embodiment.

Referring to FIG. 1, the display device 1 may display an image. In an embodiment, the display device 1 may include a substrate 10, a sub-pixel PX, a scan line SL, and a data line DL.

The substrate 10 may include a display area DA and a non-display area NDA. The s display area DA may be an area in which the display device 1 displays an image. Accordingly, the sub-pixel PX may be arranged in the display area DA. The non-display area NDA may be an area in which the display device 1 does not display an image. A driving circuit and/or a power wiring of the display device 1 may be arranged in the non-display area NDA. In an embodiment, the non-display area NDA may at least partially surround the display area DA. For example, the non-display area NDA may entirely surround the display area DA.

The sub-pixel PX may be arranged in the display area DA. The sub-pixel PX may emit light. In an embodiment, a plurality of sub-pixels PX may be provided, and the display device 1 may display an image by using light emitted by the plurality of sub-pixels PX.

The sub-pixel PX may be electrically connected to the scan line SL that transmits a scan signal and the data line DL that transmits a data signal. The sub-pixel PX may receive the scan signal and the data signal to emit light.

The scan line SL may transmit a scan signal. In an embodiment, the scan line SL may extend in a first direction (e.g., a positive x direction or a negative x direction). The scan line SL may be electrically connected to the sub-pixel PX. In an embodiment, the scan line SL may receive a scan signal from a driving circuit.

The data line DL may transmit a data signal. In an embodiment, the data line DL may extend in a second direction (e.g., a positive y direction or a negative y direction). The data line DL may be electrically connected to the sub-pixel PX.

Figure 2:
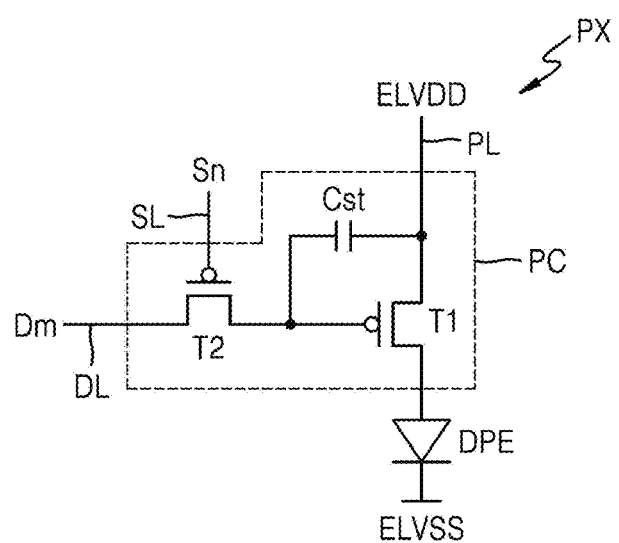
FIG. 2 is a schematic equivalent circuit diagram of a representative sub-pixel of a display device of FIG. 1.

FIG. 2 is a schematic equivalent circuit diagram of any one sub-pixel PX of the display device 1 according to an embodiment.

Referring to FIG. 2, the sub-pixel PX may include a pixel circuit PC and a display element DPE electrically connected to the pixel circuit PC. The pixel circuit PC may include a driving thin-film transistor T1, a switching thin-film transistor T2, and a storage capacitor Cst. For example, the sub-pixel PX may emit red light, green light, or blue light, or may emit red light, green light, blue light, or white light through the display element DPE.

The switching thin-film transistor T2 may be connected to the scan line SL and the data line DL. For example, the switching thin-film transistor T2 may transmit, to the driving thin-film transistor T1, a data voltage or a data signal Dm input from the data line DL according to a scan voltage or a scan signal Sn input from the scan line SL.

The storage capacitor Cst may be connected to the switching thin-film transistor T2 and a driving voltage line PL. For example, the storage capacitor Cst may store a voltage corresponding to a difference between a voltage received from the switching thin-film transistor T2 and a first power voltage ELVDD supplied to the driving voltage line PL.

The driving thin-film transistor T1 may be connected to the driving voltage line PL and the storage capacitor Cst. For example, the driving thin-film transistor T1 may control a driving current flowing from the driving voltage line PL to the display element DPE, in accordance with a voltage value stored in the storage capacitor Cst. The display element DPE may emit light having a certain luminance according to the driving current. An opposite electrode (e.g., a cathode) of the display element DPE may receive a second power voltage ELVSS that has a voltage level lower than the first power voltage ELVDD.

FIG. 2 illustrates that the pixel circuit PC includes two thin-film transistors and one storage capacitor. However, in another embodiment, the pixel circuit PC may include three or more thin-film transistors.

In an embodiment, the display element DPE may be an organic light-emitting diode including an organic emission layer. Alternatively, the display element DPE may be a light-emitting diode. The light-emitting diode may have a microscale size or a nanoscale size. For example, the light-emitting diode may be a micro-light-emitting diode. Alternatively, the light-emitting diode may be a nanorod light-emitting diode. The nanorod light-emitting diode may include gallium nitride (GaN). In an embodiment, a color conversion layer may be arranged on the nanorod light-emitting diode. The color conversion layer may include quantum dots. Alternatively, the display element DPE may be a quantum dot light-emitting diode including a quantum dot emission layer. Alternatively, the display element DPE may be an inorganic light-emitting diode including an inorganic semiconductor.

Figure 3:
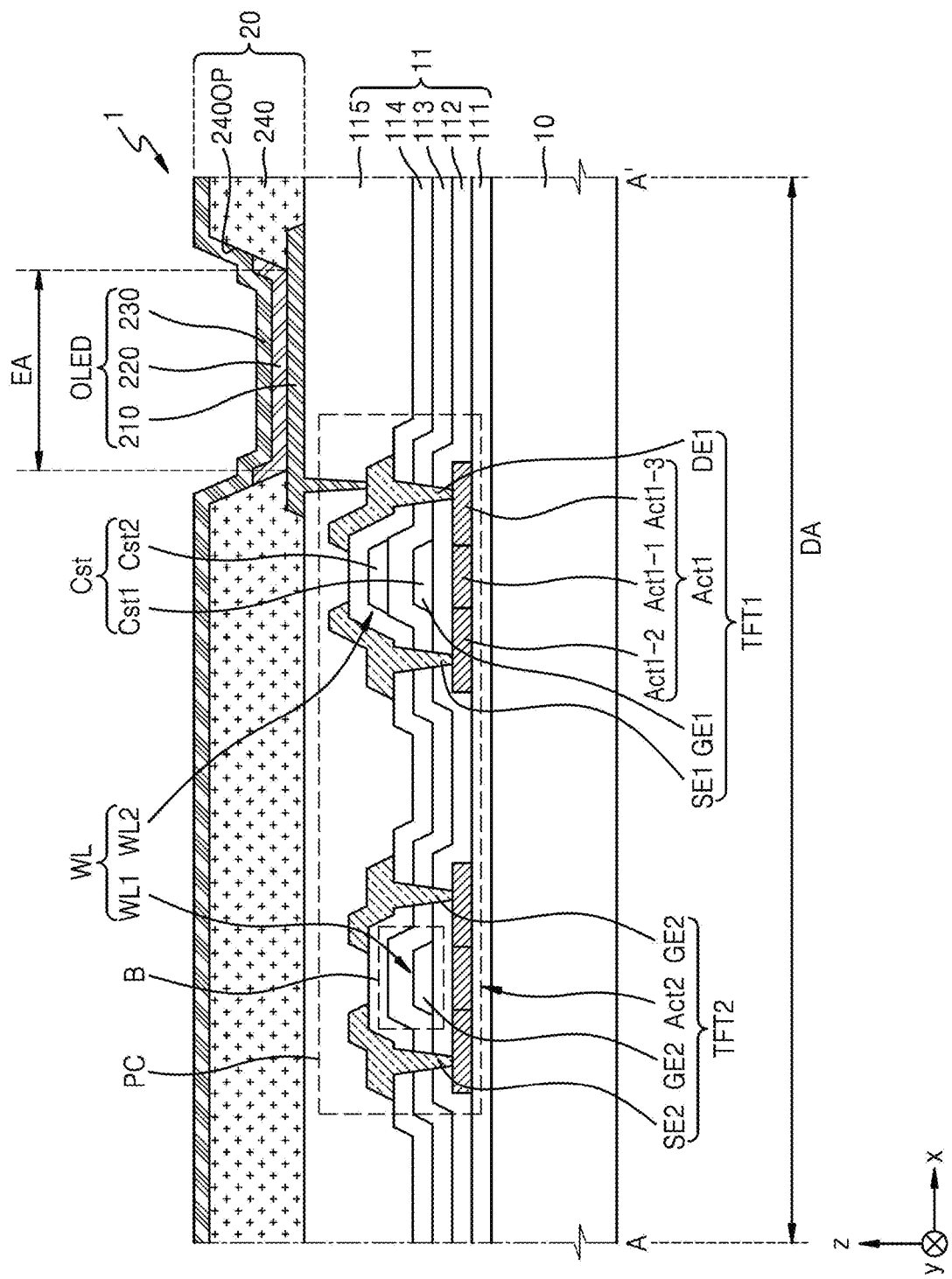
FIG. 3 is a schematic cross-sectional view taken along line A-A' of FIG. 1.

FIG. 3 is a schematic cross-sectional view of the display device 1 of FIG. 1, taken along line A-A'.

Referring to FIG. 3, the display device 1 may include the substrate 10, a pixel circuit layer 11, and a display element layer 20. The pixel circuit layer 11 and the display element layer 20 may be sequentially arranged on the substrate 10.

The substrate 10 may include the display area DA. In an embodiment, the substrate 10 may include glass. In another embodiment, the substrate 10 may include a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. In an embodiment, the substrate 10 may have a multi-layer structure including a base layer including the above-described polymer resin and a barrier layer.

A barrier layer may be further arranged between the pixel circuit layer 11 and the substrate 10. The barrier layer is a layer for preventing penetration of external foreign materials, and may include a single layer or multiple layers including an inorganic material such as silicon nitride ($SiN_x$) or silicon oxide ($SiO_2$).

The pixel circuit layer 11 may be arranged on the substrate 10. The pixel circuit layer 11 may include the pixel circuit PC, and a buffer layer 111, a first inorganic insulating layer 112, a second inorganic insulating layer 113, a third inorganic insulating layer 114, and an organic insulating layer 115 arranged below and/or above components of the pixel circuit PC. In an embodiment, the pixel circuit layer 11 may include a wiring WL. The pixel circuit PC may include a first thin-film transistor TFT1, a second thin-film transistor TFT2, and the storage capacitor Cst. In an embodiment, the first thin-film transistor TFT1 may be the driving thin-film transistor T1 of FIG. 2. In an embodiment, the second thin-film transistor TFT2 may be the switching thin-film transistor T2 of FIG. 2.

The buffer layer 111 may be arranged on the substrate 10. The buffer layer 111 may include an inorganic insulating material such as silicon nitride ($SiN_x$), silicon oxynitride ($SiO_xN_y$), and silicon oxide ($SiO_2$), and may include a single layer or multiple layers including the above-described inorganic insulating material.

The first thin-film transistor TFT1 may include a first semiconductor layer Act1, a first gate electrode GE1, a first source electrode SE1, and a first drain electrode DE1. The second thin-film transistor TFT2 may include a second semiconductor layer Act2, a second gate electrode GE2, a second source electrode SE2, and a second drain electrode DE2. Because the second semiconductor layer Act2, the second gate electrode GE2, the second source electrode SE2, and the second drain electrode DE2 are respectively similar to the first semiconductor layer Act1, the first gate electrode GE1, the first source electrode SE1, and the first drain electrode DE1, detailed descriptions thereof will be omitted for descriptive convenience.

The first semiconductor layer Act1 may be arranged on the buffer layer 111. The first semiconductor layer Act1 may include polysilicon. Alternatively, the first semiconductor layer Act1 may include amorphous silicon, an oxide semiconductor, or an organic semiconductor. In an embodiment, the first semiconductor layer Act1 may include a channel region Act1-1, and a source region Act1-2 and a drain region Act1-3 respectively arranged on both sides of the channel region Act1-1.

The first gate electrode GE1 may overlap the channel region Act1-1 of the first semiconductor layer Act1. The first gate electrode GE1 may include a low-resistance metal material.

The first inorganic insulating layer 112 may be arranged between the first semiconductor layer Act1 and the first gate electrode GE1. The first inorganic insulating layer 112 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO).

The second inorganic insulating layer 113 may cover the first gate electrode GE1. The second inorganic insulating layer 113 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO), like the first inorganic insulating layer 112.

An upper electrode Cst2 of the storage capacitor Cst may be arranged on the second inorganic insulating layer 113. In an embodiment, the upper electrode Cst2 may overlap the first gate electrode GE1. In this case, the first gate electrode GE1 and the upper electrode Cst2 overlapping each other with the second inorganic insulating layer 113 therebetween may constitute the storage capacitor Cst. For example, the first gate electrode GE1 may function as a lower electrode Cst1 of the storage capacitor Cst. As such, the storage capacitor Cst and the first thin-film transistor TFT1 may overlap each other. In another embodiment, the storage capacitor Cst and the first thin-film transistor TFT1 may not overlap each other. In an embodiment, the storage capacitor Cst and the second thin-film transistor TFT2 may not overlap each other.

The third inorganic insulating layer 114 may cover the upper electrode Cst2. The third inorganic insulating layer 114 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The third inorganic insulating layer 114 may include a single layer or multiple layers including the above-described inorganic insulating material.

Each of the first source electrode SE1 and the first drain electrode DE1 may be arranged on the third inorganic insulating layer 114. At least one of the first source electrode SE1 and the first drain electrode DE1 may include a material having high conductivity. At least one of the first source electrode SE1 and the first drain electrode DE1 may include a conductive material such as molybdenum (Mo), aluminum (Al), copper (Cu), or titanium (Ti), and may include a single layer or multiple layers including the above-described material. In an embodiment, at least one of the first source electrode SE1 and the first drain electrode DE1 may have a multi-layer structure of Ti/Al/Ti.

The wiring WL may be arranged on the first inorganic insulating layer 112. In an embodiment, the second inorganic insulating layer 113 may cover the wiring WL. In other words, the wiring WL may be arranged between the first inorganic insulating layer 112 and the second inorganic insulating layer 113. In another embodiment, the wiring WL may be arranged between the second inorganic insulating layer 113 and the third inorganic insulating layer 114. In another embodiment, the wiring WL may include a first wiring WL1 and a second wiring WL2. The first wiring WL1 may be arranged between the first inorganic insulating layer 112 and the second inorganic insulating layer 113. The second wiring WL2 may be arranged between the second inorganic insulating layer 113 and the third inorganic insulating layer 114.

The wiring WL may be a gate wiring. In an embodiment, the first wiring WL1 may be integrally provided or formed with at least one of the first gate electrode GE1 and the second gate electrode GE2. In an embodiment, the second wiring WL2 may be provided or formed integrally with the upper electrode Cst2 of the storage capacitor Cst.

The wiring WL may include a lower layer, an intermediate layer, and an upper layer that are sequentially stacked. The lower layer may include at least one of aluminum (Al) and an aluminum alloy. The intermediate layer may include titanium aluminide ($Ti_xAl_y$). The upper layer may include at least one of titanium (Ti) and titanium oxide. Accordingly, the wiring WL may have low resistance.

Unlike the embodiments, when the wiring WL includes molybdenum (Mo), a thickness of the wiring WL may be increased in order to reduce resistance of the wiring WL. In this case, due to stress applied on the wiring WL, the thickness of the wiring WL may not be sufficiently increased. In the embodiments, the wiring WL includes at least one of aluminum (Al) and an aluminum alloy, and thus may have low resistance even when the thickness of the wiring WL is not sufficiently increased.

The organic insulating layer 115 may include an organic material. The organic insulating layer 115 may include an organic insulating material such as a general purpose polymer (e.g., polymethyl methacrylate (PMMA) or polystyrene (PS)), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The display element layer 20 may be arranged on the pixel circuit layer 11. The display element layer 20 may include an organic light-emitting diode OLED as a display element and a pixel-defining layer 240. For example, the organic light-emitting diode OLED may emit red light, green light, or blue light, or may emit red light, green light, blue light, or white light. In an embodiment, the organic light-emitting diode OLED as a display element may be arranged on the second inorganic insulating layer 113. The organic light-emitting diode OLED may include a pixel electrode 210, an emission layer 220, and an opposite electrode 230.

The pixel electrode 210 may be arranged on the organic insulating layer 115. The pixel electrode 210 may be electrically connected to the first thin-film transistor TFT1 through a contact hole of the organic insulating layer 115. The pixel electrode 210 may include a conductive oxide such as indium tin oxide (ITO), indium zinc oxide (IZO), zinc oxide (ZnO), indium oxide ($In_2O_3$), indium gallium oxide (IGO) or aluminum zinc oxide (AZO). In another embodiment, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 210 may further include a layer provided or formed of ITO, IZO, ZnO, or $In_2O_3$ above/below the reflective layer.

The pixel-defining layer 240 having an opening 2400P exposing a central portion of the pixel electrode 210 may be arranged on the pixel electrode 210. The pixel-defining layer 240 may include an organic insulating material and/or an inorganic insulating material. The opening 2400P may define an emission area EA of light emitted by the organic light-emitting diode OLED. For example, a width of the opening 2400P may be a width of the emission area EA.

The emission layer 220 may be arranged in the opening 2400P of the pixel-defining layer 240. The emission layer 220 may include a high-molecular weight organic material or a low-molecular weight organic material for emitting light of a certain color. For example, a first functional layer and a second functional layer may be respectively arranged below and above the emission layer 220. For example, the first functional layer may include a hole transport layer (HTL), or may include an HTL and a hole injection layer (HIL). The second functional layer is a component arranged on the emission layer 220 and is optional. The second functional layer may include an electron transport layer (ETL) and/or an electron injection layer (EIL). The first functional layer and/or the second functional layer may be a common layer provided or formed to entirely cover the substrate 10, like the opposite electrode 230 described below.

The opposite electrode 230 may be arranged on the emission layer 220. The opposite electrode 230 may be provided or formed of a conductive material having a low work function. For example, the opposite electrode 230 may include a transparent layer (or a semi-transparent layer) including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the opposite electrode 230 may further include a layer such as ITO, IZO, ZnO, or $In_2O_3$ on the transparent layer (or the semi-transparent layer) including the above-described material.

For example, an encapsulation layer may be arranged on the display element layer 20. The encapsulation layer may include at least one inorganic encapsulation layer and at least one organic encapsulation layer covering the display element layer 20. In an embodiment, the at least one inorganic encapsulation layer and the at least one organic encapsulation layer may be alternately stacked. The inorganic encapsulation layer may include one or more inorganic materials selected from aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride ($SiO_xN_y$). The organic encapsulation layer may include a polymer-based material. The polymer-based material may include an acryl-based resin, an epoxy-based resin, polyimide, and polyethylene. In an embodiment, the organic encapsulation layer may include acrylate.

In another embodiment, a sealing substrate may be arranged on the display element layer 20. The sealing substrate may seal the display element layer 20 together with a sealing member arranged in the non-display area. In another embodiment, the encapsulation layer and the sealing substrate may be simultaneously arranged on the display element layer 20.

A touch sensor layer may be arranged on the encapsulation layer. The touch sensor layer may obtain coordinate information according to an external input, for example, a touch event.

An anti-reflection layer may be arranged on the touch sensor layer. The anti-reflection layer may reduce reflectance of light incident toward the display device 1. In an embodiment, the anti-reflection layer may include a phase retarder and/or a polarizer. The phase retarder may be a film-type or a liquid crystal-coating type, and may include a λ/2 phase retarder and/or a λ/4 phase retarder. The polarizer may also be a film-type or a liquid crystal coating-type. The film-type may include a stretchable synthetic resin film, and the liquid crystal-coating type may include liquid crystals arranged in a certain arrangement. The retarder and the polarizer may further include a protective film.

In another embodiment, the anti-reflection layer may include a black matrix and color filters. The color filters may be arranged according to a color of light emitted by each of a plurality of display elements of the display device 1. Each of the color filters may include a red pigment or dye, a green pigment or dye, or a blue pigment or dye. Alternatively, each of the color filters may further include quantum dots in addition to the pigment or dye. Alternatively, some of the color filters may not include the pigment or dye, and may include scattering particles such as titanium oxide.

In another embodiment, the anti-reflection layer may include a destructive interference structure. The destructive interference structure may include a first reflective layer and a second reflective layer arranged on different layers from each other. First reflected light and second reflected light respectively reflected by the first reflective layer and the second reflective layer may destructively interfere with each other, and thus, reflectance of external light may be reduced.

Figure 4:
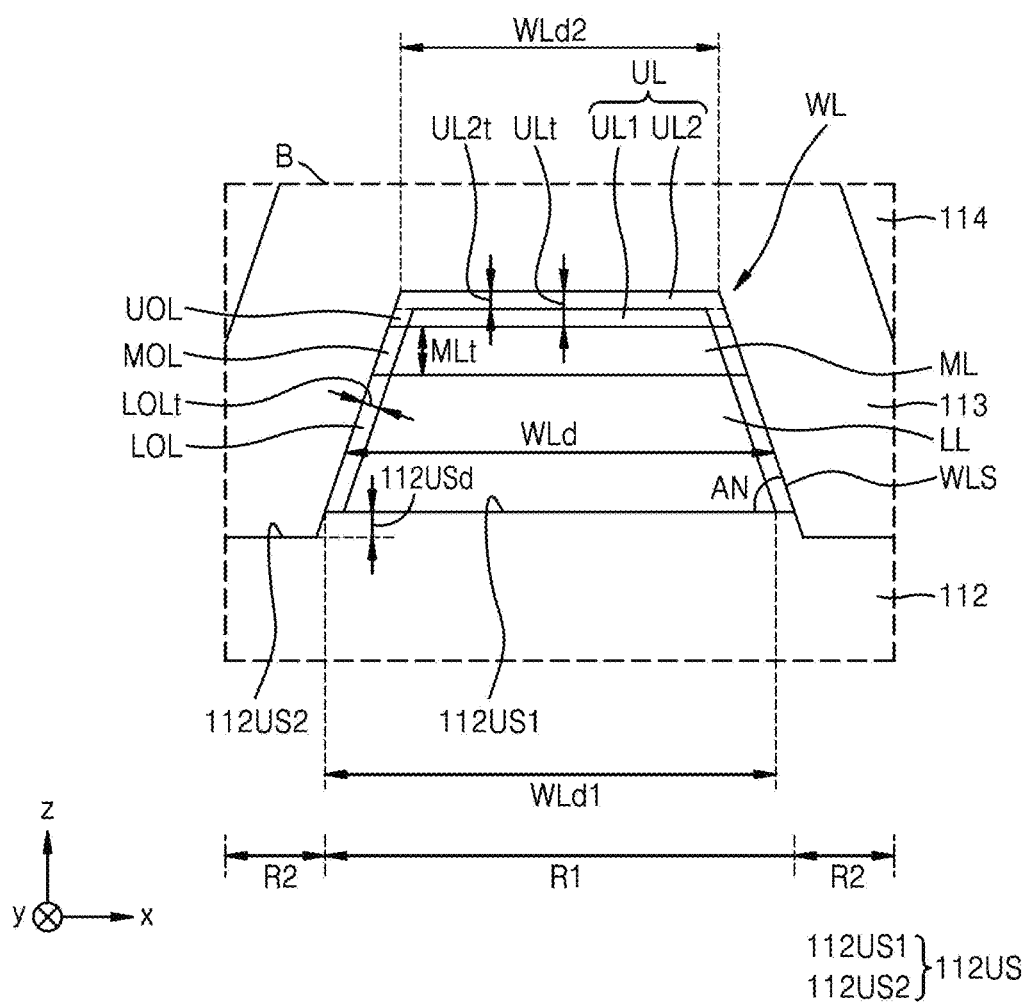
FIG. 4 is an enlarged view of region B of FIG. 3.

FIG. 4 is an enlarged view of region B of the display device 1 of FIG. 3. In FIG. 4, the same reference numerals as those in FIG. 3 denote the same members, and thus, redundant descriptions thereof will be omitted for descriptive convenience.

Referring to FIG. 4, the display device 1 may include the first inorganic insulating layer 112, the wiring WL, the second inorganic insulating layer 113, the third inorganic insulating layer 114, and a display element.

The first inorganic insulating layer 112 may include a first region R1 and a second region R2. The first region R1 may be a region overlapping the wiring WL. In an embodiment, the first region R1 may be a region overlapping a lower layer LL. The second region R2 may be a region adjacent to the first region R1. In an embodiment, the second region R2 may be arranged outside the first region R1. The second region R2 may be a region that does not overlap the wiring WL.

The first inorganic insulating layer 112 may include an upper surface 112US. The upper surface 112US of the first inorganic insulating layer 112 may be a surface facing at least one of the wiring WL and the second inorganic insulating layer 113. The upper surface 112US of the first inorganic insulating layer 112 may include a first upper surface 112US1 of the first inorganic insulating layer 112 and a second upper surface 112US2 of the first inorganic insulating layer 112. The first upper surface 112US1 of the first inorganic insulating layer 112 may be the upper surface 112US of the first inorganic insulating layer 112 that overlaps the first region R1. The second upper surface 112US2 of the first inorganic insulating layer 112 may be the upper surface 112US of the first inorganic insulating layer 112 that overlaps the second region R2.

In an embodiment, the upper surface 112US of the first inorganic insulating layer 112 in the first region R1 and the upper surface 112US of the first inorganic insulating layer 112 in the second region R2 may have a step difference 112USd therebetween. In other words, the first upper surface 112US1 of the first inorganic insulating layer 112 and the second upper surface 112US2 of the first inorganic insulating layer 112 may have the step difference 112USd therebetween. The first upper surface 112US1 of the first inorganic insulating layer 112 may have a higher level than the second upper surface 112US2 of the first inorganic insulating layer 112 by the step difference 112USd of the first inorganic insulating layer 112. In an embodiment, the step difference 112USd of the first inorganic insulating layer 112 may be formed by over-etching the first inorganic insulating layer 112 when forming the wiring WL by a dry-etching process. In an embodiment, the step difference 112USd of the first inorganic insulating layer 112 may be from about 200 Å to about 500 Å.

The wiring WL may be arranged on the first inorganic insulating layer 112. In an embodiment, the wiring WL may be arranged directly on the first inorganic insulating layer 112. In other words, a component may not be arranged between the wiring WL and the first inorganic insulating layer 112.

A width WLd of the wiring WL may decrease in a direction in which the second inorganic insulating layer 113 is stacked from the first inorganic insulating layer 112. The width WLd of the wiring WL may be a distance between a first portion of a side surface WLS of the wiring WL and a second portion of the side surface WLS of the wiring WL in a first direction (e.g., a positive x direction or a negative x direction) and/or a second direction (e.g., a positive y direction or a negative y direction). For example, the first portion and the second portion of the side surface WLS of the wiring WL may be opposite to each other in the first direction and/or the second direction. In an embodiment, the width WLd of the wiring WL may decrease in a third direction (e.g., a positive z direction or a negative z direction) perpendicular to the first direction (e.g., the positive x direction or the negative x direction) and the second direction (e.g., the positive y direction or the negative y direction). In an embodiment, a first width WLd1 of the wiring WL on a lower surface of the wiring WL facing the first inorganic insulating layer 112 may be greater than a second width WLd2 of the wiring WL on an upper surface of the wiring WL facing the second inorganic insulating layer 113.

The wiring WL may not have an undercut structure. Alternatively, the wiring WL may not have a protruding tip. When the wiring WL has an undercut structure or a protruding tip unlike the embodiments, cracks may occur in the second inorganic insulating layer 113 and/or the third inorganic insulating layer 114. In the embodiments, because the width WLd of the wiring WL decreases in the direction in which the second inorganic insulating layer 113 is stacked from the first inorganic insulating layer 112, the occurrence of cracks in the second inorganic insulating layer 113 and/or the third inorganic insulating layer 114 may be prevented or reduced.

The wiring WL may include the lower layer LL, an intermediate layer ML, an upper layer UL, a lower oxide layer LOL, an intermediate oxide layer MOL, and an upper oxide layer UOL. In an embodiment, a plurality of lower layers LL, a plurality of intermediate layers ML, and a plurality of upper layers UL may be provided. For example, the wiring WL may further include an additional lower layer including the same material as that of the lower layer LL, an additional intermediate layer including the same material as that of the intermediate layer ML, and an additional upper layer including the same material as that of the upper layer UL. In this case, the lower layer LL, the intermediate layer ML, the upper layer UL, the additional lower layer, the additional intermediate layer, and the additional upper layer may be sequentially stacked. In some embodiments, the wiring WL may be a wiring in which the above-described stacked structure is repeatedly stacked.

The wiring WL may be heat-treated. The intermediate layer ML, the lower oxide layer LOL, the intermediate oxide layer MOL, and the upper oxide layer UOL may be layers formed when the lower layer LL and the upper layer UL are heat-treated.

The lower layer LL may be arranged on the first inorganic insulating layer 112. The lower layer LL may include at least one of aluminum (Al) and an aluminum alloy. The aluminum alloy may include at least one of nickel (Ni), lanthanum (La), neodymium (Nd), and germanium (Ge). In an embodiment, an elemental ratio of the at least one of nickel (Ni), lanthanum (La), neodymium (Nd), and germanium (Ge) in the aluminum alloy may not exceed 2 at %. In an embodiment, an elemental ratio of nickel (Ni) in the aluminum alloy may be from about 0.01 at % to about 0.05 at %, and an elemental ratio of lanthanum (La) in the aluminum alloy may be from about 0.01 at % to about 0.1 at %. In an embodiment, each of the elemental ratio of nickel (Ni) and the elemental ratio of lanthanum (La) in the aluminum alloy may not exceed 0.1 at %. In an embodiment, the sum of the elemental ratio of nickel (Ni) and the elemental ratio of lanthanum (La) in the aluminum alloy may not exceed 0.15 at %. When the aluminum alloy satisfies the above conditions, resistivity of the aluminum alloy and resistivity of pure aluminum (Al) may be substantially the same, and the wiring WL may have low resistance. For example, the at % means the percentage of one kind of atom relative to the total number of atoms. For example, resistivity means electrical resistance of a conductor of unit cross-sectional area and unit length.

The upper layer UL may be arranged on the lower layer LL. The upper layer UL may include at least one of titanium (Ti) and titanium oxide ($TiO_x$). In an embodiment, the upper layer UL may include a first upper layer UL1 and a second upper layer UL2. The first upper layer UL1 may include titanium (Ti). The second upper layer UL2 may be arranged on the first upper layer UL1. The second upper layer UL2 may include titanium oxide ($TiO_x$). In some embodiments, the first upper layer UL1 may be omitted.

A thickness ULt of the upper layer UL may be from about 30 Å to about 400 Å. The thickness ULt of the upper layer UL may be a distance from an upper surface of the intermediate layer ML to an upper surface of the wiring WL. In an embodiment, a thickness UL2t of the second upper layer UL2 may be from about 50 Å to about 200 Å. The thickness UL2t of the second upper layer UL2 may be a distance from an upper surface of the first upper layer UL1 to the upper surface of the wiring WL. When the thickness ULt of the upper layer UL is less than about 30 Å, a capping effect with respect to hillock defects of the intermediate layer ML may not be achieved. For example, when the thickness ULt of the upper layer UL is less than about 30 Å, the upper layer UL may not compensate for the hillock defects of the intermediate layer ML. When the thickness ULt of the upper layer UL is greater than about 400 Å, a profile (e.g., an outer surface) of the wiring WL may become non-uniform. In this case, defects such as a short circuit may occur in the wiring WL. In the embodiments, because the thickness ULt of the upper layer UL is from about 30 Å to about 400 Å, the profile of the wiring WL may be uniform. Accordingly, the occurrence of defects such as a short circuit in the wiring WL may be prevented or reduced.

The intermediate layer ML may be arranged between the lower layer LL and the upper layer UL. The intermediate layer ML may include titanium aluminide ($Ti_xAl_y$). In an embodiment, $Ti_xAl_y$ may be TiAl. In another embodiment, each of x and y values in $Ti_xAl_y$ may a positive number. The intermediate layer ML may be a layer formed when the lower layer LL and the upper layer UL are heat-treated. The intermediate layer ML may be a layer formed by inter-diffusion occurring between the lower layer LL and the upper layer UL.

A thickness MLt of the intermediate layer ML may be proportional to the thickness ULt of the upper layer UL. The thickness MLt of the intermediate layer ML may be a distance between a lower surface of the intermediate layer ML facing an upper surface of the lower layer LL and an upper surface of the intermediate layer ML facing a lower surface of the upper layer UL. In an embodiment, when the thickness ULt of the upper layer UL is about 50 Å, the thickness MLt of the intermediate layer ML may be about 100 nm or less. In another embodiment, when the thickness ULt of the upper layer UL is about 100 Å, the thickness MLt of the intermediate layer ML may be about 150 nm or less. In another embodiment, when the thickness ULt of the upper layer UL is about 200 Å, the thickness MLt of the intermediate layer ML may be about 200 nm or less. In another embodiment, when the thickness ULt of the upper layer UL is about 300 Å, the thickness MLt of the intermediate layer ML may be about 200 nm or more.

The intermediate layer ML may be a layer capable of preventing or reducing thermal corrosion of the lower layer LL. In order to precisely and accurately form the wiring WL, the lower layer LL and the upper layer UL may be formed by dry-etching. In this case, a gas including chlorine gas may be supplied, and after a dry-etching process is completed, at least one of chlorine (Cl) and chlorine radicals may be arranged on a side surface of the lower layer LL and a side surface of the upper layer UL. The at least one of chlorine (Cl) and chlorine radicals may cause defects of the wiring WL in a subsequent process, which is performed at a high temperature, for example, a process of forming an insulating layer, after the wiring WL is formed. In the embodiments, the intermediate layer ML may be arranged between the lower layer LL and the upper layer UL. In this case, after the dry-etching process is completed, the occurrence of defects of the wiring WL due to the at least one of chlorine (Cl) and chlorine radicals arranged on the side surface of the lower layer LL and the side surface of the upper layer UL may be prevented or reduced. In other words, the intermediate layer ML may prevent or reduce thermal corrosion of the wiring WL.

Unlike the embodiments, in a case where the upper layer UL includes titanium nitride (TiN), inter-diffusion between the lower layer LL and the upper layer UL may not occur even when the lower layer LL and the upper layer UL are heat-treated, and the intermediate layer ML may not be formed. In this case, the thermal corrosion of the wiring WL may not be prevented or reduced. In the embodiments, when forming the wiring WL, the upper layer UL may include titanium (Ti). Accordingly, inter-diffusion between the lower layer LL and the upper layer UL may occur to form the intermediate layer ML, and the thermal corrosion of the wiring WL may be prevented or reduced.

The lower oxide layer LOL may be arranged on a side surface of the lower layer LL. In an embodiment, the lower oxide layer LOL may surround an outer surface of the lower layer LL. In an embodiment, the lower oxide layer LOL may include aluminum oxide ($AlO_x$). Here, x may be a positive number. In an embodiment, a thickness LOLt of the lower oxide layer LOL may be from about 10 nm to about 40 nm. The thickness LOLt of the lower oxide layer LOL may be a distance from the outer surface of the lower layer LL to an outer surface of the lower oxide layer LOL. Unlike the embodiments, when heat treatment is performed on the lower layer LL and the upper layer UL in a structure in which the intermediate layer ML is not formed in the wiring WL, the lower oxide layer LOL may be formed to have an average thickness of about 5 nm. In the embodiments, because heat treatment is performed on the lower layer LL and the upper layer UL in a structure in which the intermediate layer ML may be formed in the wiring WL, the thickness LOLt of the lower oxide layer LOL may be from about 10 nm to about 40 nm.

The intermediate oxide layer MOL may be arranged on a side surface of the intermediate layer ML. In an embodiment, the intermediate oxide layer MOL may surround an outer surface of the intermediate layer ML. In an embodiment, the intermediate oxide layer MOL may include at least one of titanium oxide ($TiO_x$), aluminum oxide ($AlO_x$), and aluminum titanium oxide ($Al_xTi_yO_z$). Here, x, y, and z may be positive numbers.

The upper oxide layer UOL may be arranged on a side surface of the upper layer UL. In an embodiment, the upper oxide layer UOL may surround an outer surface of the upper layer UL. In an embodiment, the upper oxide layer UOL may be integrally provided or formed with the second upper layer UL2. In an embodiment, the upper oxide layer UOL may include titanium oxide ($TiO_x$). Here, x may be a positive number.

An angle AN between the upper surface 112US of the first inorganic insulating layer 112 facing the wiring WL and the side surface WLS of the wiring WL may be about 70 degrees or less. In other words, the angle AN between the first upper surface 112US1 of the first inorganic insulating layer 112 and the side surface WLS of the wiring WL may be about 70 degrees or less. The side surface WLS of the wiring WL may be a surface connected to a lower surface of the wiring WL facing the first upper surface 112US1 of the first inorganic insulating layer 112. In an embodiment, when the angle AN between the upper surface 112US of the first inorganic insulating layer 112 facing the wiring WL and the side surface WLS of the wiring WL is about 70 degrees or less, and the step difference 112USd of the first inorganic insulating layer 112 is from about 200 Å to about 500 Å, the wiring WL may have a sheet resistance of 0.2 ohm/sq or less.

The second inorganic insulating layer 113 may cover the wiring WL. The second inorganic insulating layer 113 may extend along a shape of the wiring WL. In the embodiments, because the wiring WL does not have an undercut structure or a protruding tip, cracks may not occur in the second inorganic insulating layer 113. Accordingly, reliability of the display device 1 may be improved. In an embodiment, the second inorganic insulating layer 113 may be arranged directly on the wiring WL. In other words, a component may not be arranged between the second inorganic insulating layer 113 and the wiring WL. The third inorganic insulating layer 114 may be arranged on the second inorganic insulating layer 113. The third inorganic insulating layer 114 may extend along a shape of the second inorganic insulating layer 113. In the embodiments, because the wiring WL does not have an undercut structure or a protruding tip, cracks may not occur in the third inorganic insulating layer 114.

FIGS. 5A to 5F are schematic cross-sectional views illustrating a method of manufacturing a display device, according to an embodiment. In FIGS. 5A to 5F, the same reference numerals as those in FIG. 4 denote the same members, and thus, redundant descriptions thereof will be omitted for descriptive convenience.

Figure 5A:
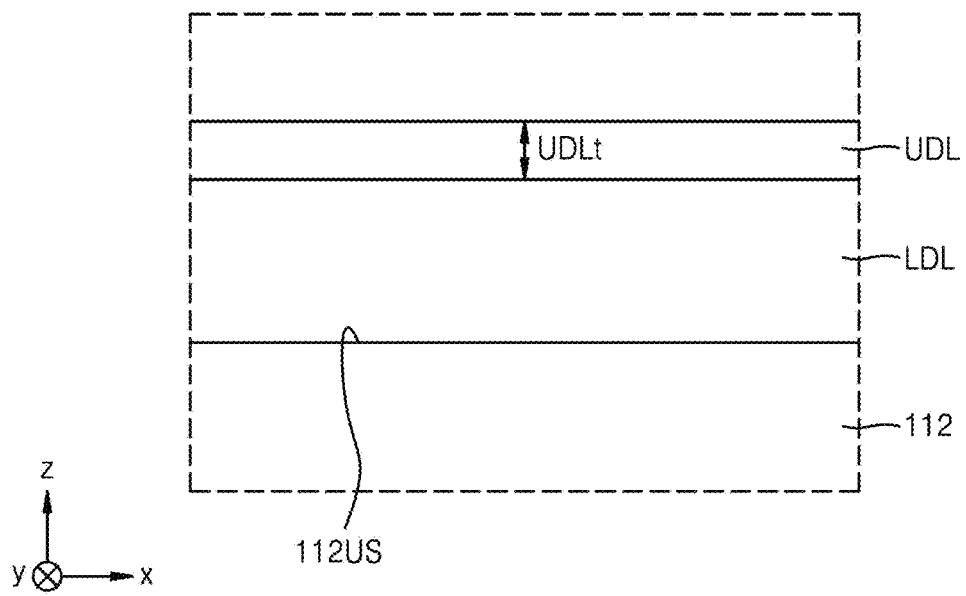
FIGS. 5A, 5B, 5C, 5D, 5E, and 5F are schematic cross-sectional views illustrating a method of manufacturing a display device according to the principles of the invention.

Referring to FIG. 5A, a lower conductive layer LDL and an upper conductive layer UDL arranged on the first inorganic insulating layer 112 may be prepared. In an embodiment, the upper surface 112US of the first inorganic insulating layer 112 may not have a step difference. For example, the upper surface 112US of the first inorganic insulating layer 112 may extend in a first direction (e.g., a positive x direction or a negative x direction) and/or a second direction (e.g., a positive y direction or a negative y direction.

The lower conductive layer LDL may be arranged on the first inorganic insulating layer 112. The lower conductive layer LDL may include at least one of aluminum (Al) and an aluminum alloy. The aluminum alloy may include at least one of nickel (Ni), lanthanum (La), neodymium (Nd), and germanium (Ge). In an embodiment, an elemental ratio of the at least one of nickel (Ni), lanthanum (La), neodymium (Nd), and germanium (Ge) in the aluminum alloy may not exceed 2 at %. In an embodiment, an elemental ratio of nickel (Ni) in the aluminum alloy may be from about 0.01 at % to about 0.05 at %, and an elemental ratio of lanthanum (La) in the aluminum alloy may be from about 0.01 at % to about 0.1 at %. In an embodiment, each of the elemental ratio of nickel (Ni) and the elemental ratio of lanthanum (La) in the aluminum alloy may not exceed 0.1 at %.

The upper conductive layer UDL may be arranged on the lower conductive layer LDL. The upper conductive layer UDL may include titanium (Ti). A thickness UDLt of the upper conductive layer UDL may be from about 30 Å to about 400 Å.

Figure 5B:
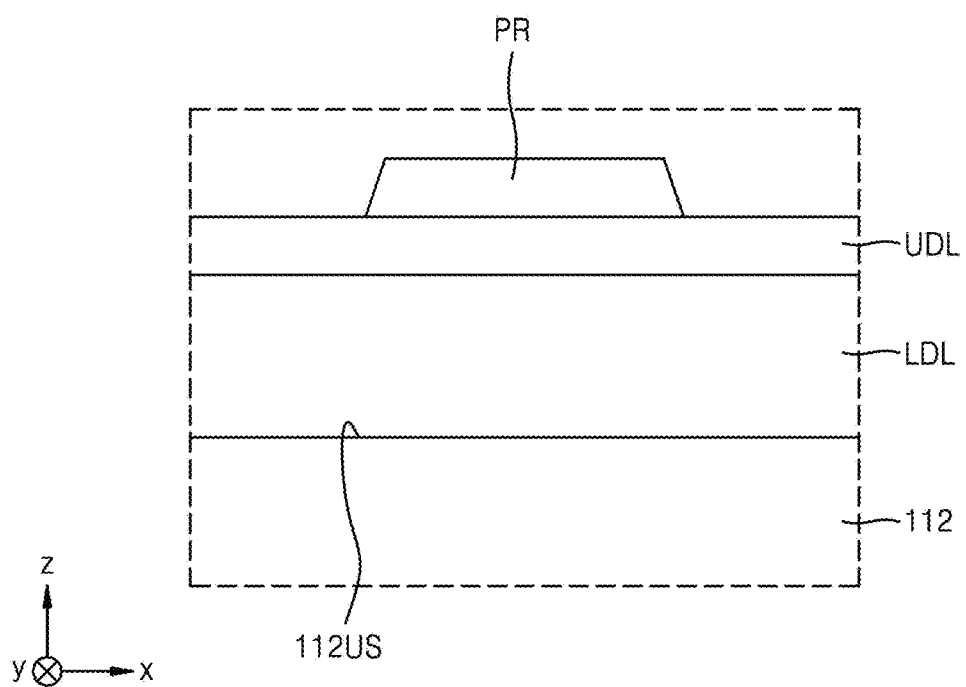
Figure 5C:
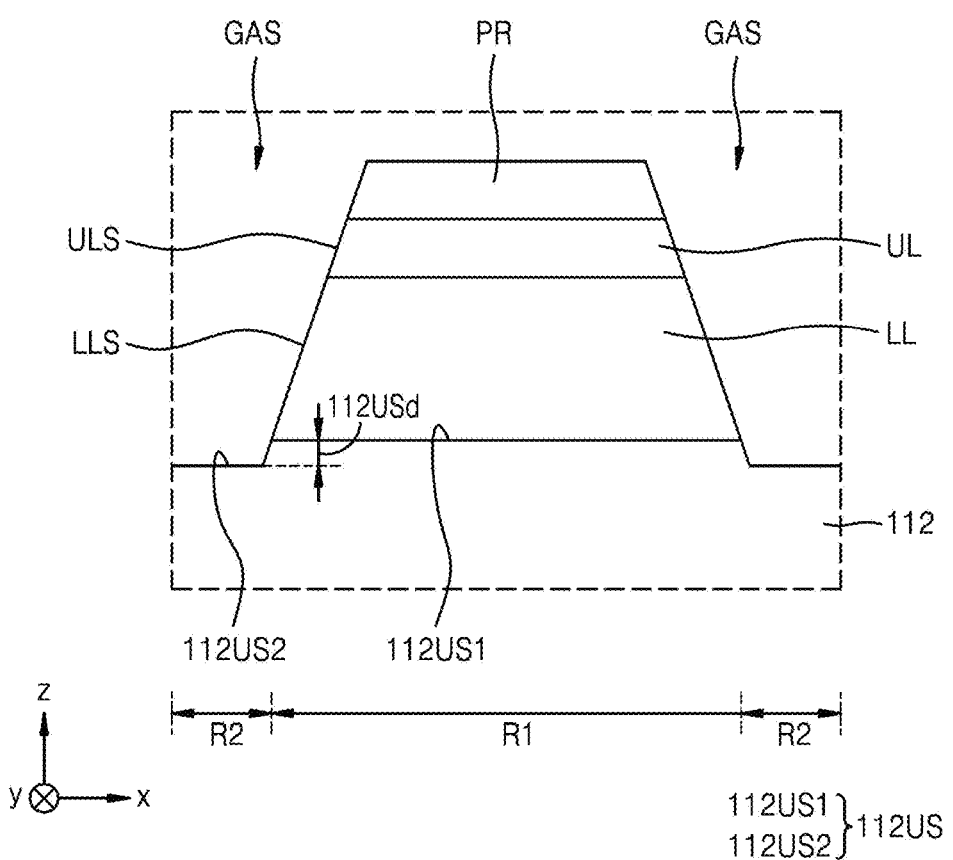
Figure 5D:
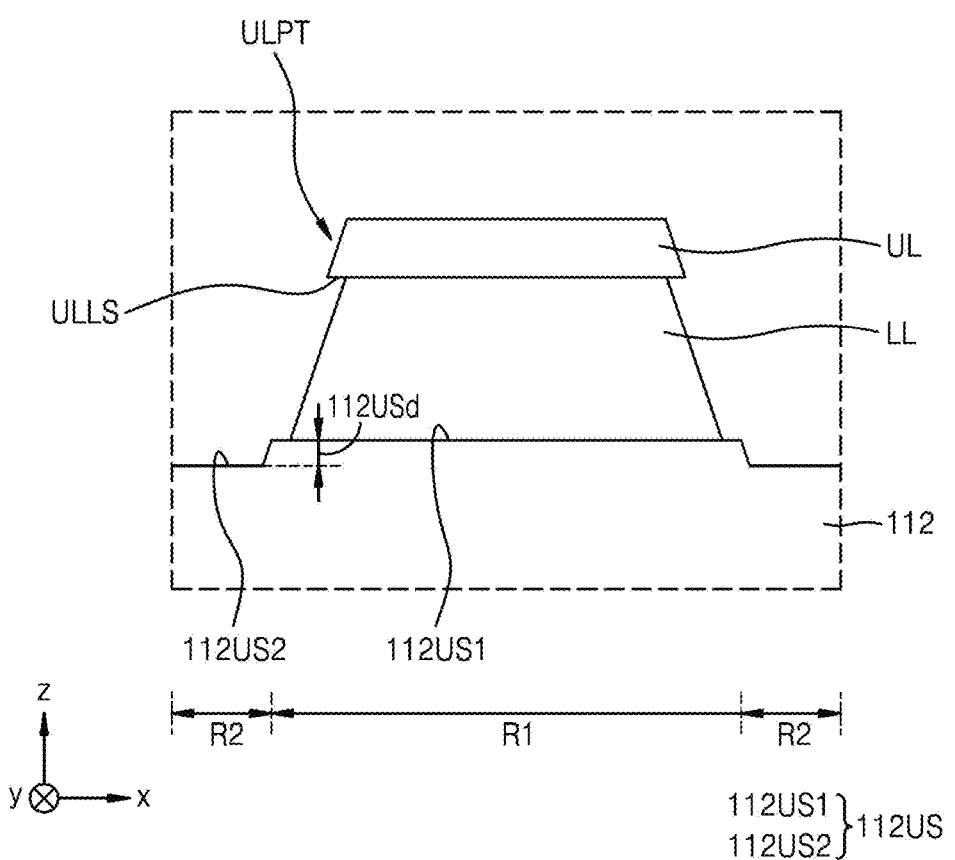

Referring to FIGS. 5B to 5D, a portion of the lower conductive layer LDL and a portion of the upper conductive layer UDL may be etched. In an embodiment, the portion of the lower conductive layer LDL and the portion of the upper conductive layer UDL may be dry-etched. Accordingly, the lower layer LL and the upper layer UL may be provided or formed.

Referring to FIGS. 5B and 5C, a photoresist pattern PR may be formed on the upper conductive layer UDL. In an embodiment, the photoresist pattern PR may include an organic insulating material.

A portion of the lower conductive layer LDL and a portion of the upper conductive layer UDL may be dry-etched by using the photoresist pattern PR as a photomask. In an embodiment, a portion of the lower conductive layer LDL and a portion of the upper conductive layer UDL that do not overlap the photoresist pattern PR may be dry-etched. Another portion of the lower conductive layer LDL and another portion of the upper conductive layer UDL that overlap the photoresist pattern PR may not be dry-etched. Accordingly, the lower layer LL and the upper layer UL on the lower layer LL may be provided or formed. Another portion of the lower conductive layer LDL may be the lower layer LL. Another portion of the upper conductive layer UDL may be the upper layer UL.

When the lower conductive layer LDL and the upper conductive layer UDL are dry-etched, a gas GAS may be supplied. In an embodiment, the gas GAS may include at least one of chlorine ($Cl_2$), boron trichloride ($BCl_3$), and nitrogen ($N_2$). Accordingly, after a portion of the lower conductive layer LDL and a portion of the upper conductive layer UDL are dry-etched, at least one of chlorine (Cl) and chlorine radicals may remain on a side surface LLS of the lower layer LL and a side surface ULS of the upper layer UL.

The first inorganic insulating layer 112 may be over-etched. The first inorganic insulating layer 112 may include the first region R1 and the second region R2. In an embodiment, the first region R1 may be a region overlapping the lower layer LL. The second region R2 may be a region adjacent to the first region R1. In an embodiment, the second region R2 may be arranged outside the first region R1. The second region R2 may be a region that does not overlap the lower layer LL.

The upper surface 112US of the first inorganic insulating layer 112 may include the first upper surface 112US1 of the first inorganic insulating layer 112 and the second upper surface 112US2 of the first inorganic insulating layer 112. The first upper surface 112US1 of the first inorganic insulating layer 112 may be the upper surface 112US of the first inorganic insulating layer 112 that overlaps the first region R1. The second upper surface 112US2 of the first inorganic insulating layer 112 may be the upper surface 112US of the first inorganic insulating layer 112 that overlaps the second region R2.

In an embodiment, the upper surface 112US of the first inorganic insulating layer 112 in the first region R1 and the upper surface 112US of the first inorganic insulating layer 112 in the second region R2 may have the step difference 112USd therebetween. In other words, the first upper surface 112US1 of the first inorganic insulating layer 112 and the second upper surface 112US2 of the first inorganic insulating layer 112 may have the step difference 112USd therebetween. The first upper surface 112US1 of the first inorganic insulating layer 112 may have a higher level than the second upper surface 112US2 of the first inorganic insulating layer 112 by the step difference 112USd of the first inorganic insulating layer 112. In an embodiment, the step difference 112USd of the first inorganic insulating layer 112 may be from about 200 Å to about 500 Å.

Referring to FIG. 5D, the photoresist pattern PR may be removed. The photoresist pattern PR may be removed by a stripping process. In an embodiment, when the photoresist pattern PR is removed, at least a portion of the lower layer LL may be removed. In other words, the at least a portion of the lower layer LL may be removed due to etching damage caused by a stripper used in the stripping process. In this case, at least a portion of a lower surface ULLS of the upper layer UL facing the lower layer LL may be exposed. For example, the upper layer UL may be provided or formed with a protruding tip ULPT protruding from the lower layer LL.

Figure 5E:
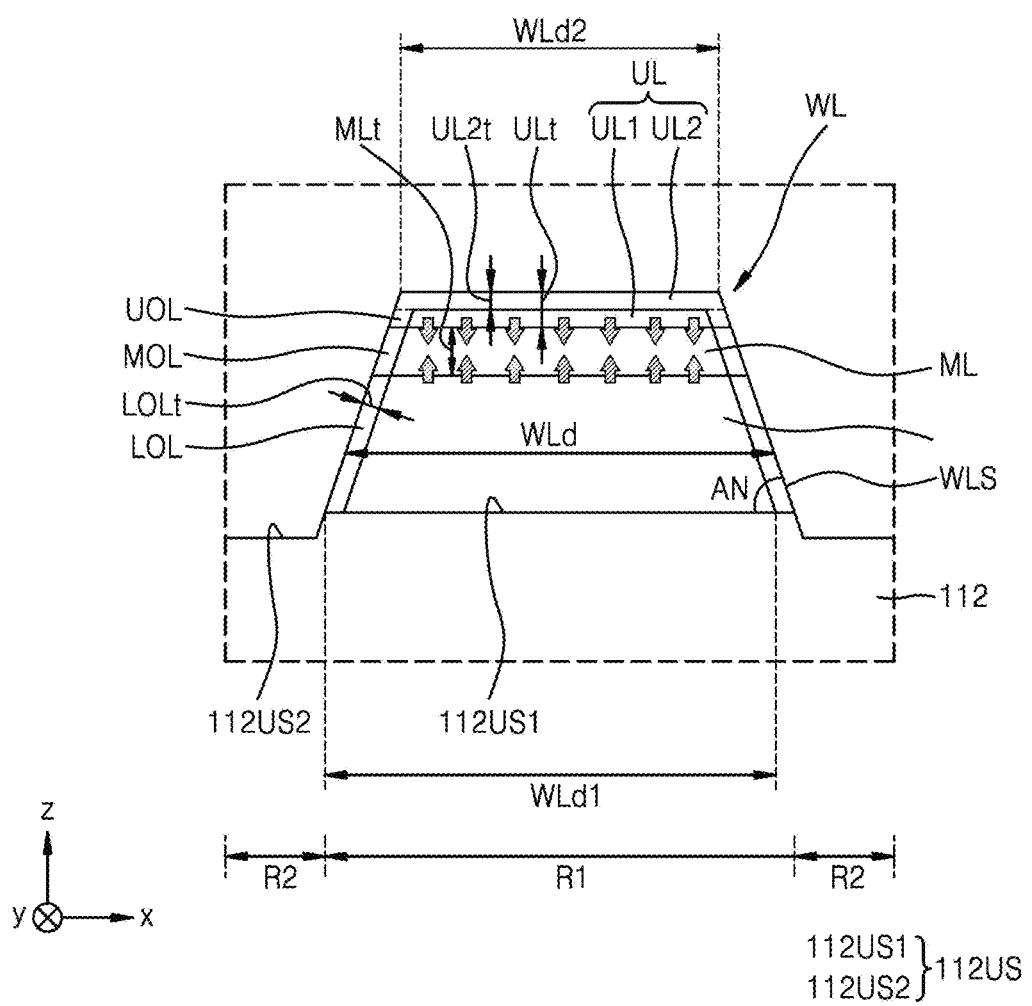

Referring to FIG. 5E, the lower layer LL and the upper layer UL may be heat-treated. The heat treatment may be performed at high temperature. In an embodiment, the heat treatment may be performed at a temperature from about 350° C. to about 500° C. In an embodiment, a time period for which the heat treatment is performed may be about 30 minutes. In another embodiment, the time period for which the heat treatment is performed may be less than 30 minutes or greater than 30 minutes.

Inter-diffusion between the lower layer LL and the upper layer UL may occur. In an embodiment, a first metal atom included in the lower layer LL may diffuse into the upper layer UL, and a second metal atom included in the upper layer UL may diffuse into the lower layer LL. The first metal atom may be an aluminum (Al) atom. The second metal atom may be a titanium (Ti) atom.

The intermediate layer ML may be formed between the lower layer LL and the upper layer UL. The intermediate layer ML may be a layer formed by the inter-diffusion occurring between the lower layer LL and the upper layer UL. The intermediate layer ML may include titanium aluminide ($Ti_xAl_y$). In an embodiment, $Ti_xAl_y$ may be TiAl. In another embodiment, each of x and y values in $Ti_xAl_y$ may a positive number.

The thickness MLt of the intermediate layer ML may be proportional to the thickness ULt of the upper layer UL. The thickness MLt of the intermediate layer ML may be a distance between a lower surface of the intermediate layer ML facing an upper surface of the lower layer LL and an upper surface of the intermediate layer ML facing a lower surface of the upper layer UL. In an embodiment, when the thickness ULt of the upper layer UL is about 50 Å, the thickness MLt of the intermediate layer ML may be about 100 nm or less. In another embodiment, when the thickness ULt of the upper layer UL is about 100 Å, the thickness MLt of the intermediate layer ML may be about 150 nm or less. In another embodiment, when the thickness ULt of the upper layer UL is about 200 Å, the thickness MLt of the intermediate layer ML may be about 200 nm or less. In another embodiment, when the thickness ULt of the upper layer UL is about 300 Å, the thickness MLt of the intermediate layer ML may be about 200 nm or more.

The intermediate layer ML may be a layer capable of preventing or reducing thermal corrosion of the lower layer LL. After a dry-etching process is completed, at least one of chlorine (Cl) and chlorine radicals may be arranged on a side surface of the lower layer LL and a side surface of the upper layer UL. The at least one of chlorine (Cl) and chlorine radicals may cause defects of the wiring WL in a subsequent process, which is performed at a high temperature, for example, a process of forming an insulating layer, after the wiring WL is formed. In the embodiments, the intermediate layer ML may be formed between the lower layer LL and the upper layer UL. In this case, after the dry-etching process is completed, the occurrence of defects of the wiring WL due to the at least one of chlorine (Cl) and chlorine radicals arranged on the side surface of the lower layer LL and the side surface of the upper layer UL may be prevented or reduced. In other words, the intermediate layer ML may prevent or s reduce thermal corrosion of the wiring WL.

Unlike the embodiments, in a case where the upper layer UL or the upper conductive layer UDL includes titanium nitride (TiN), inter-diffusion between the lower layer LL and the upper layer UL may not occur, and the intermediate layer ML may not be formed. In this case, the thermal corrosion of the wiring WL may not be prevented or reduced. In the embodiments, when forming the wiring WL, the upper layer UL or the upper conductive layer UDL may include titanium (Ti). Accordingly, inter-diffusion between the lower layer LL and the upper layer UL may occur to form the intermediate layer ML, and the thermal corrosion of the wiring WL may be prevented or reduced.

When forming the intermediate layer ML, the lower oxide layer LOL, the intermediate oxide layer MOL, and the upper oxide layer UOL may be formed. The lower oxide layer LOL may be arranged on a side surface of the lower layer LL. In an embodiment, the lower oxide layer LOL may surround an outer surface of the lower layer LL. In an embodiment, the lower oxide layer LOL may include aluminum oxide ($AlO_x$). In an embodiment, the thickness LOLt of the lower oxide layer LOL may be from about 10 nm to about 40 nm.

The intermediate oxide layer MOL may be arranged on a side surface of the intermediate layer ML. In an embodiment, the intermediate oxide layer MOL may surround an outer surface of the intermediate layer ML. In an embodiment, the intermediate oxide layer MOL may include at least one of titanium oxide ($TiO_x$), aluminum oxide ($AlO_x$), and aluminum titanium oxide ($Al_xTi_yO_z$).

The upper oxide layer UOL may be arranged on a side surface of the upper layer UL. In an embodiment, the upper oxide layer UOL may surround an outer surface of the upper layer UL. In an embodiment, the upper oxide layer UOL may be integrally provided or formed with the second upper layer UL2. In an embodiment, the upper oxide layer UOL may include titanium oxide (TiO$_x$).

The upper layer UL may include the first upper layer UL1 and the second upper layer UL2. The first upper layer UL1 may include titanium (Ti). The second upper layer UL2 may be arranged on the first upper layer UL1. The second upper layer UL2 may include titanium oxide (TiO$_x$). The second upper layer UL2 may be integrally provided or formed with the upper oxide layer UOL.

When forming the intermediate layer ML, a portion of the upper layer UL may be oxidized. In this case, the portion of the upper layer UL may be the second upper layer UL2 that is oxidized, and another portion of the upper layer UL may be the first upper layer UL1 that is unoxidized. In some embodiments, the upper layer UL may be entirely oxidized. In this case, the first upper layer UL1 may be omitted.

The thickness ULt of the upper layer UL may be from about 30 Å to about 400 Å. The thickness ULt of the upper layer UL may be a distance from an upper surface of the intermediate layer ML to an upper surface of the wiring WL. In an embodiment, the thickness UL2t of the second upper layer UL2 may be from about 50 Å to about 200 Å. The thickness UL2t of the second upper layer UL2 may be a distance from an upper surface of the first upper layer UL1 to the upper surface of the wiring WL. In the embodiments, because the thickness ULt of the upper layer UL is from about 30 Å to about 400 Å, the occurrence of defects such as a short circuit in the wiring WL may be prevented or reduced.

When forming the intermediate layer ML, the protruding tip of the upper layer UL may be removed. The lower layer LL and the upper layer UL may be heat-treated at high temperature, and inter-diffusion between the lower layer LL and the upper layer UL may occur. At this time, the protruding tip of the upper layer UL may be removed. Accordingly, the wiring WL may not have an undercut structure.

The width WLd of the wiring WL may decrease in a direction in which the second inorganic insulating layer 113 is stacked from the first inorganic insulating layer 112. The width WLd of the wiring WL may be a distance between a first portion of the side surface WLS of the wiring WL and a second portion of the side surface WLS of the wiring WL in a first direction (e.g., a positive x direction or a negative x direction) or a second direction (e.g., a positive y direction or a negative y direction). For example, the first portion and the second portion of the side surface WLS of the wiring WL may be opposite to each other in the first direction and/or the second direction. In an embodiment, the width WLd of the wiring WL may decrease in a third direction (e.g., a positive z direction or a negative z direction) perpendicular to the first direction (e.g., the positive x direction or the negative x direction) and the second direction (e.g., the positive y direction or the negative y direction). In an embodiment, the first width WLd1 of the wiring WL on a lower surface of the wiring WL facing the first inorganic insulating layer 112 may be greater than the second width WLd2 of the wiring WL on an upper surface of the wiring WL facing the second inorganic insulating layer 113.

Figure 5F:
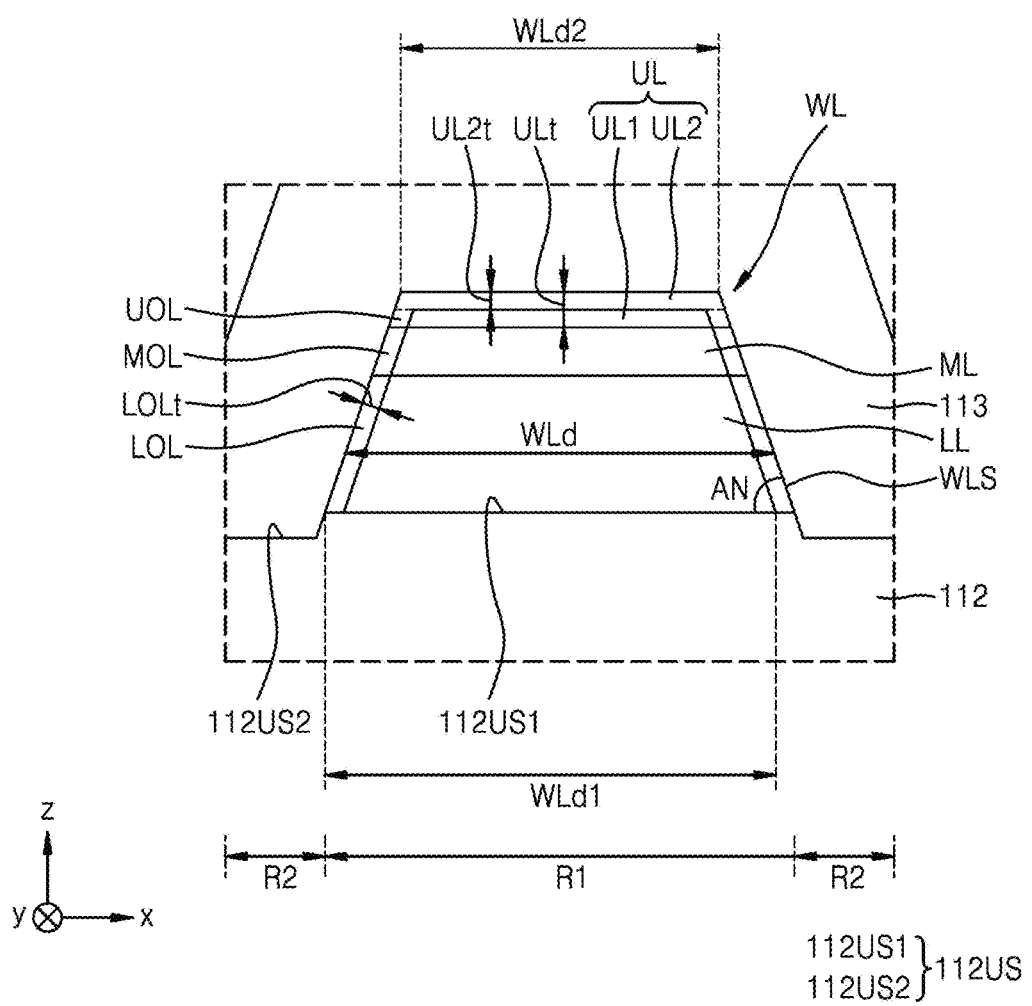

Referring to FIG. 5F, the second inorganic insulating layer 113 covering the wiring WL may be formed. In addition, a third inorganic insulating layer may be formed on the second inorganic insulating layer 113. In an embodiment, the second inorganic insulating layer 113 may cover the lower layer LL, the intermediate layer ML, and the upper layer UL. The second inorganic insulating layer 113 may extend along a shape of an outer surface of the wiring WL. Unlike the embodiments, when the wiring WL has an undercut structure or a protruding tip, cracks may occur in the second inorganic insulating layer 113. In the embodiments, because the width WLd of the wiring WL decreases in the direction in which the second inorganic insulating layer 113 is stacked from the first inorganic insulating layer 112, the occurrence of cracks in the second inorganic insulating layer 113 and/or the third inorganic insulating layer may be prevented or reduced.

FIG. 6 is a table showing thermal corrosion of a wiring according to a material of a lower layer, a material of an upper layer, and whether or not heat treatment is performed.

Referring to FIG. 6, CASE I, CASE II, CASE III, and CASE IV are shown. Heat treatment is performed at a temperature from about 350° C. to about 500° C. A thickness of the upper layer is about 30 Å.

CASE I is a case where the lower layer includes aluminum (Al), the upper layer includes titanium (Ti), and heat treatment is not performed. In CASE I, thermal corrosion is occurred in the wiring.

CASE II is a case where the lower layer includes aluminum (Al), the upper layer includes titanium nitride (TiN), and heat treatment is performed. In CASE II, thermal corrosion is occurred in the wiring. For example, when inter-diffusion is not occurred between the lower and upper layers even though heat treatment is performed as in CASE II, thermal corrosion may occur in the wiring.

CASE III is a case where each of the lower layer and the upper layer includes aluminum (Al) and heat treatment is performed. In CASE III, thermal corrosion is occurred in the wiring.

CASE IV is a case where the lower layer includes aluminum (Al), the upper layer includes titanium (Ti), and heat treatment is performed. In CASE IV, thermal corrosion is not occurred in the wiring. For example, only when an intermediate layer including titanium aluminide (Ti$_x$Al$_y$) is formed by heat treatment, defects of the wiring due to heat may be improved.

Figure 7:
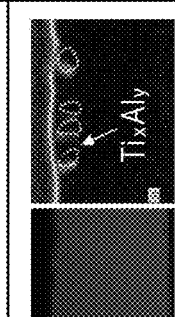
FIG. 7 is a table showing a transmission electron microscopy (TEM) analysis image according to a thickness of an upper layer.
Figure 7:
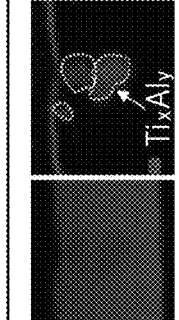
Figure 7:
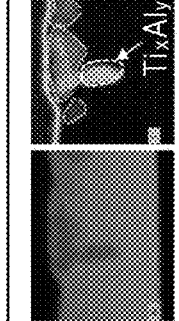
Figure 7:
Figure 7:
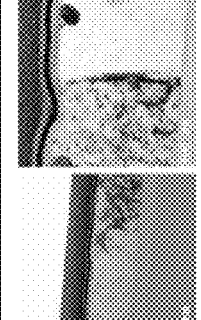
Figure 7:
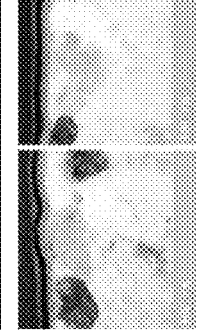

FIG. 7 is a table showing a transmission electron microscopy (TEM) analysis image according to a thickness of an upper layer.

Referring to FIG. 7, an intermediate layer formed after heat treatment and including titanium aluminide (Ti$_x$Al$_y$) is shown with respect to cases where a thickness of a lower layer is about 3,500 Å, and the thickness of the upper layer is about 50 Å, about 100 Å, and about 200 Å, respectively. Heat treatment is performed at a temperature from about 350° C. to about 500° C. A TEM mapping shows a distribution of aluminum (Al) and titanium (Ti) for each case. A TEM image, which has a size of about 200 nm or about 100 nm, shows the lower layer, the intermediate layer, and the upper layer.

A thickness of the intermediate layer may be proportional to the thickness of the upper layer. In an embodiment, when the thickness of the upper layer is about 50 Å, the thickness of the intermediate layer may be about 100 nm or less. In another embodiment, when the thickness of the upper layer is about 100 Å, the thickness of the intermediate layer may be about 150 nm or less. In another embodiment, when the thickness of the upper layer is about 200 Å, the thickness of the intermediate layer may be about 200 nm or less. In another embodiment, when the thickness of the upper layer is about 300 Å, the thickness of the intermediate layer may be about 200 nm or more.

Figure 8A:
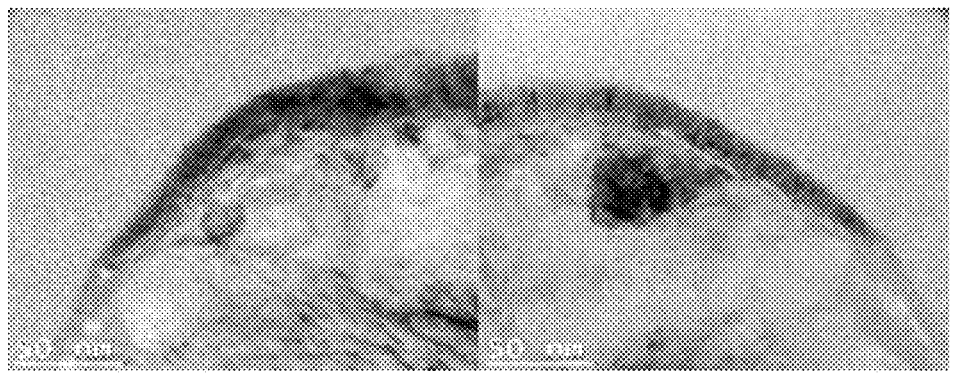
FIG. 8A is an image of a wiring heat-treated according to an embodiment.
Figure 8B:
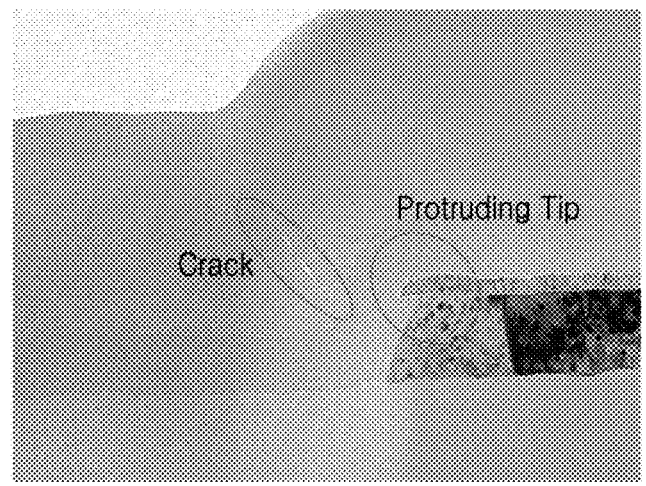
FIG. 8B is an image of a wiring according to a comparative example.

FIG. 8A is an image of a wiring heat-treated according to an embodiment. FIG. 8B is an image of a wiring according to a comparative example.

Referring to FIG. 8A, it is an image of the wiring heat-treated according to an embodiment, which has a size of about 50 nm. The wiring heat-treated according to an embodiment may include a lower layer including at least one of aluminum (Al) and an aluminum alloy, an upper layer arranged on the lower layer and including at least one of titanium (Ti) and titanium oxide, and an intermediate layer arranged between the lower layer and the upper layer and including titanium aluminide ($Ti_xAl_y$). In the embodiments, inter-diffusion between the lower layer and the upper layer may occur, and a protruding tip of the upper layer may be removed. Accordingly, the wiring formed through heat treatment may not have an undercut structure. In this case, the occurrence of cracks in an inorganic insulating layer arranged on the wiring may be prevented or reduced.

Referring to FIG. 8B, it is a cross-sectional view of the wiring according to the comparative example. In the wiring according to the comparative example, a lower layer may include at least one of aluminum (Al) and an aluminum alloy, and an upper layer may include titanium (Ti). However, the wiring may not be heat-treated, and thus may not include an intermediate layer. In a wiring according to another comparative example, the lower layer may include at least one of aluminum (Al) and an aluminum alloy, and the upper layer may include titanium nitride (TiN). In this case, the wiring according to the comparative example may have an undercut structure. Alternatively, the wiring according to the comparative example may have a protruding tip. Accordingly, cracks or seams may occur in an inorganic insulating layer arranged on the wiring according to the comparative example.

FIG. 9A is a schematic cross-sectional image of a wiring according to an embodiment. FIG. 9B is a schematic cross-sectional image of a wiring according to a comparative example.

Referring to FIG. 9A, the wiring according to an embodiment is shown with respect to cases where a thickness of a lower layer is about 3,500 Å, and a thickness of an upper layer is about 50 Å and about 300 Å, respectively. A transmission electron microscopy (TEM) mapping shows a distribution of oxygen (O) for each case. A transmission electron microscopy (TEM) Image, which has a size of about 50 nm, shows the wiring according to an embodiment.

The wiring according to an embodiment may include a lower layer including at least one of aluminum (Al) and an aluminum alloy, an upper layer arranged on the lower layer and including at least one of titanium (Ti) and titanium oxide, and an intermediate layer arranged between the lower layer and the upper layer and including titanium aluminide ($Ti_xAl_y$). In addition, the wiring according to an embodiment may include a lower oxide layer arranged on a side surface of the lower layer.

A thickness of the lower oxide layer according to an embodiment may be from about 10 nm to about 40 nm. For example, when the thickness of the upper layer is about 50 Å, the lower oxide layer according to an embodiment may have an average thickness of about 12 nm. FIG. 9A shows a lower oxide layer having thicknesses of about 10.2 nm, about 10.7 nm, about 11.8 nm, and about 16.2 nm. As another example, when the thickness of the upper layer is about 300 Å, the lower oxide layer according to an embodiment may have an average thickness of about 27 nm. FIG. 9A shows a lower oxide layer having thicknesses of about 21.5 nm, about 23.3 nm, about 29.1 nm, and about 33.1 nm.

Referring to FIG. 9B, the wiring according to the comparative example is shown with respect to a case where a thickness of a lower layer is about 3,000 Å, and a thickness of an upper layer is about 300 Å. A transmission electron microscopy (TEM) mapping shows a distribution of oxygen (O). A transmission electron microscopy (TEM) Image, which has a size of about 50 nm, shows the wiring according to the comparative example.

The wiring according to the comparative example may include a lower layer including aluminum (Al) and an upper layer including titanium nitride (TiN). In this case, even when heat treatment is performed on the wiring according to the comparative example, an intermediate layer including titanium aluminide ($Ti_xAl_y$) may not be formed. The wiring according to the comparative example may include a lower oxide layer arranged on a side surface of the lower layer.

The lower oxide layer of the wiring according to the comparative example may have an average thickness of about 5 nm. FIG. 9B shows a lower oxide layer having thicknesses of about 5.1 nm, about 6.8 nm, and about 8 nm. As such, the thickness of the lower oxide layer included in the wiring according to an embodiment, which includes an intermediate layer including titanium aluminide ($Ti_xAl_y$), may be greater than the thickness of the lower oxide layer included in the wiring of the comparative example, which does not include an intermediate layer including titanium aluminide ($Ti_xAl_y$).

Figure 10:
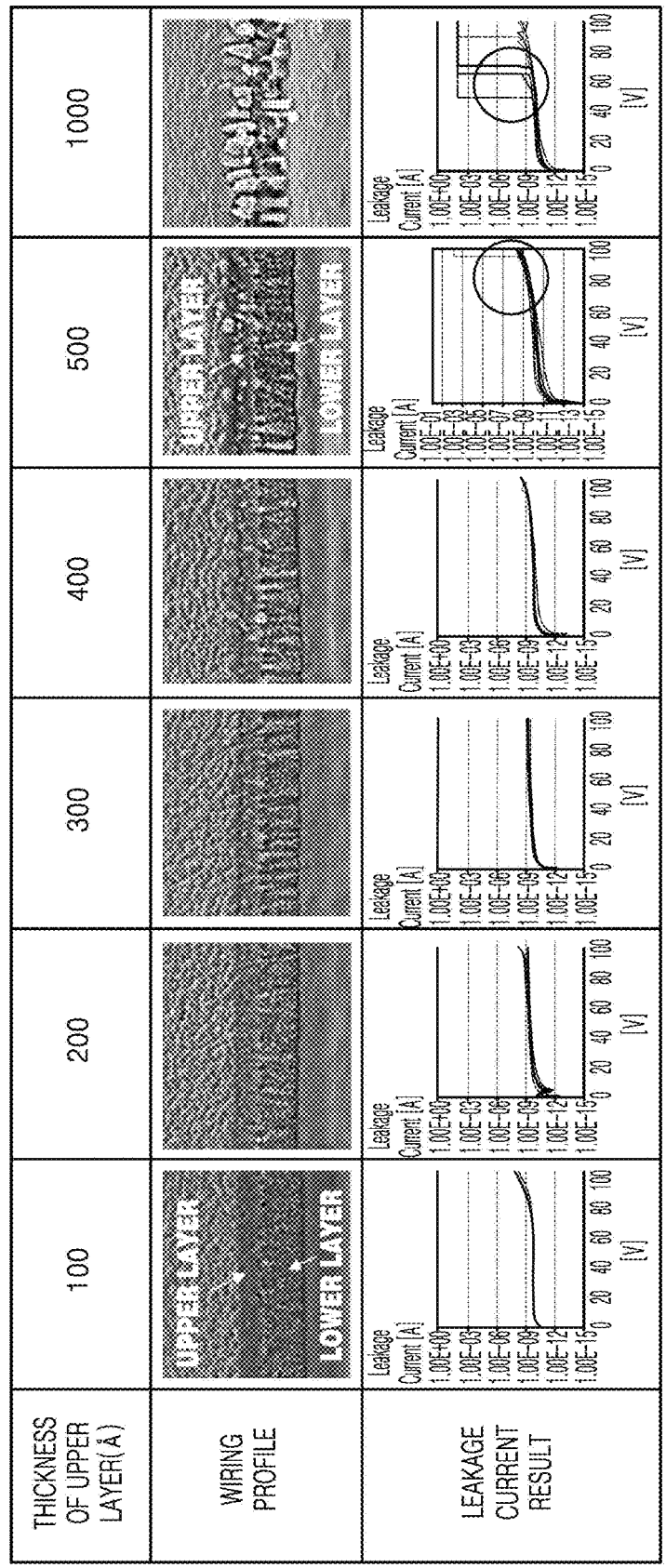
FIG. 10 is a table showing a profile of a wiring and a leakage current result according to a thickness of an upper layer.

FIG. 10 is a table showing a profile of a wiring and a leakage current result according to a thickness of an upper layer.

Referring to FIG. 10, when the thickness of the upper layer is greater than about 400 Å, the profile of the wiring may become non-uniform. For example, when the thickness of the upper layer is about 500 Å, the profile of the wiring may become non-uniform, and protrusions may be provided or formed in the wiring. In addition, when the thickness of the upper layer is about 500 Å or more, a leakage current may occur. For example, defects such as a short circuit may occur in the wiring.

In the embodiments, because the thickness of the upper layer is from about 30 Å to about 400 Å, the profile of the wiring may be uniform. In addition, in the embodiments, the occurrence of defects such as a short circuit in the wiring may be prevented or reduced.

As described above, a wiring of a display device according to embodiments may include a lower layer including at least one of aluminum (Al) and an aluminum alloy, an upper layer arranged on the lower layer and including at least one of titanium (Ti) and titanium oxide, and an intermediate layer arranged between the lower layer and the upper layer and including titanium aluminide ($Ti_xAl_y$). Accordingly, the wiring may prevent or reduce thermal corrosion while having low resistance.

In addition, in a method of manufacturing a display device according to embodiments, a portion of a lower conductive layer and a portion of an upper conductive layer may be dry-etched to provide a lower layer and an upper layer on the lower layer, and the lower layer and the upper layer may be heat-treated to form an intermediate layer including titanium aluminide ($Ti_xAl_y$). Accordingly, a wiring of a display device manufactured by the method of manufacturing a display device according to embodiments may prevent or reduce thermal corrosion while having low resistance.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a first inorganic insulating layer;
a wiring disposed on the first inorganic insulating layer;
a second inorganic insulating layer covering the wiring; and
a display element disposed on the second inorganic insulating layer,
wherein the wiring comprises:
a lower layer comprising at least one of aluminum and an aluminum alloy;
an uppermost layer disposed on the lower layer, the uppermost layer comprising titanium oxide; and
an intermediate layer disposed between the lower layer and the uppermost layer, the intermediate layer comprising titanium aluminide.

2. The display device of claim 1, wherein a width of the wiring in a horizontal direction decreases with increasing distance in a vertical direction in which the second inorganic insulating layer is stacked from the first inorganic insulating layer.

3. The display device of claim 1, wherein the wiring further comprises:
a first upper layer disposed between the uppermost layer and the intermediate layer, the first upper layer comprising titanium,
wherein material compositions of the uppermost layer and the first upper layer are different from each other.

4. The display device of claim 3, wherein a combined thickness of the uppermost layer and the first upper layer is in a range of about 30 Å to about 400 Å.

5. The display device of claim 1, wherein an angle between an upper surface of the first inorganic insulating layer facing the wiring and a side surface of the wiring is about 70 degrees or less.

6. The display device of claim 1, wherein:
the first inorganic insulating layer comprises a first region overlapping the wiring and a second region adjacent to the first region, and
an upper surface of the first inorganic insulating layer in the first region and an upper surface of the first inorganic insulating layer in the second region have a step difference therebetween.

7. The display device of claim 1, wherein;
the lower layer comprises the aluminum alloy; and
the aluminum alloy comprises at least one of nickel, lanthanum, neodymium, and germanium.

8. The display device of claim 1, wherein the wiring is heat-treated.

9. A display device comprising:
a first inorganic insulating layer;
a wiring disposed on the first inorganic insulating layer;
a second inorganic insulating layer covering the wiring; and
a display element disposed on the second inorganic insulating layer,
wherein the wiring comprises:
a lower layer comprising at least one of aluminum and an aluminum alloy;
an upper layer disposed on the lower layer, the upper layer comprising at least one of titanium and titanium oxide;
an intermediate layer disposed between the lower layer and the uppermost layer, the intermediate layer comprising titanium aluminide:
a lower oxide layer disposed on a side surface of the lower layer;
an intermediate oxide layer disposed on a side of the intermediate layer; and
an upper oxide layer disposed on a side surface of the upper layer.

10. The display device of claim 9, wherein a thickness of the lower oxide layer is in a range of about 10 nm to about 40 nm.

* * * * *